United States Patent
Sun et al.

(10) Patent No.: US 10,584,068 B2
(45) Date of Patent: *Mar. 10, 2020

(54) RARE-EARTH OXIDE BASED CHAMBER MATERIAL

(71) Applicant: Applied Materials, Inc., Santa Clara, CA (US)

(72) Inventors: Jennifer Y. Sun, Mountain View, CA (US); Biraja P. Kanungo, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/796,495

(22) Filed: Oct. 27, 2017

(65) Prior Publication Data

US 2018/0044247 A1    Feb. 15, 2018

Related U.S. Application Data

(60) Continuation of application No. 15/211,933, filed on Jul. 15, 2016, now Pat. No. 9,884,787, which is a
(Continued)

(51) Int. Cl.
*C04B 35/505*     (2006.01)
*C04B 35/486*     (2006.01)
(Continued)

(52) U.S. Cl.
CPC ............ *C04B 35/50* (2013.01); *C04B 35/505* (2013.01); *C04B 35/62222* (2013.01); *C04B 35/62655* (2013.01); *C04B 37/001* (2013.01); *C04B 37/02* (2013.01); *C23C 4/11* (2016.01);
*C23C 4/134* (2016.01); *C23C 14/221* (2013.01); *C23C 16/405* (2013.01); *C23C 16/4401* (2013.01);
(Continued)

(58) Field of Classification Search
CPC .. C04B 35/505; C04B 35/486; C04B 35/4885
See application file for complete search history.

(56) References Cited

U.S. PATENT DOCUMENTS 4,166,831 A    9/1979    Rhodes et al.
5,766,693 A    6/1998    Rao
(Continued)

FOREIGN PATENT DOCUMENTS

CN    102260855 A    11/2011
JP    2000001362     1/2000
(Continued)

OTHER PUBLICATIONS

International Search Report & Written Opinion of the International Searching Authority dated Feb. 24, 2015, in International Application No. PCT/US2014/065080.
(Continued)

*Primary Examiner* — Karl E Group
(74) *Attorney, Agent, or Firm* — Lowenstein Sandler LLP

(57) ABSTRACT

An article comprises a plasma resistant ceramic material comprising 80-90 mol % of $Y_2O_3$, over 0 mol % to 20 mol % of $ZrO_2$, and 10-20 mol % of $Al_2O_3$.

17 Claims, 6 Drawing Sheets

Related U.S. Application Data division of application No. 14/531,785, filed on Nov. 3, 2014, now Pat. No. 9,440,886.

(60) Provisional application No. 61/903,215, filed on Nov. 12, 2013.

(51) Int. Cl.

| | | |
|---|---|---|
| C04B 35/111 | (2006.01) | |
| H01L 21/67 | (2006.01) | |
| C04B 35/50 | (2006.01) | |
| C04B 35/626 | (2006.01) | |
| C04B 37/00 | (2006.01) | |
| C04B 37/02 | (2006.01) | |
| H01L 21/687 | (2006.01) | |
| C23C 16/44 | (2006.01) | |
| H01J 37/32 | (2006.01) | |
| C23C 4/11 | (2016.01) | |
| C23C 4/134 | (2016.01) | |
| C04B 35/622 | (2006.01) | |
| C23C 16/40 | (2006.01) | |
| H01L 21/683 | (2006.01) | |
| C23C 16/455 | (2006.01) | |
| C23C 16/50 | (2006.01) | |
| C23C 14/22 | (2006.01) | |

(52) U.S. Cl.
CPC ........ *C23C 16/45525* (2013.01); *C23C 16/50* (2013.01); *H01J 37/32082* (2013.01); *H01L 21/67069* (2013.01); *H01L 21/67109* (2013.01); *H01L 21/67248* (2013.01); *H01L 21/6833* (2013.01); *H01L 21/68757* (2013.01); *C04B 2235/3217* (2013.01); *C04B 2235/3224* (2013.01); *C04B 2235/3225* (2013.01); *C04B 2235/3244* (2013.01); *C04B 2235/3418* (2013.01); *C04B 2235/656* (2013.01); *C04B 2235/96* (2013.01); *C04B 2235/9669* (2013.01); *C04B 2237/34* (2013.01); *C04B 2237/341* (2013.01); *C04B 2237/348* (2013.01); *C04B 2237/40* (2013.01)

(56) References Cited

U.S. PATENT DOCUMENTS

| | | | |
|---|---|---|---|
| 5,827,791 A | 10/1998 | Pauliny et al. | |
| 6,383,964 B1 | 5/2002 | Nakahara et al. | |
| 6,776,873 B1 | 8/2004 | Sun et al. | |
| 6,783,875 B2 | 8/2004 | Yamada et al. | |
| 6,858,332 B2 | 2/2005 | Yamada | |
| 7,226,673 B2 | 6/2007 | Yamada et al. | |
| 7,507,268 B2 | 3/2009 | Rosenflanz | |
| 7,696,117 B2 | 4/2010 | Sun et al. | |
| 7,879,179 B2 | 2/2011 | Otsuki | |
| 8,034,734 B2 | 10/2011 | Sun et al. | |
| 8,206,829 B2 | 6/2012 | Sun et al. | |
| 8,367,227 B2 | 2/2013 | Sun et al. | |
| 8,623,527 B2 | 1/2014 | Sun et al. | |
| 8,679,998 B2 | 3/2014 | Watanabe et al. | |
| 8,685,313 B2 | 4/2014 | Watanabe et al. | |
| 8,871,312 B2 | 10/2014 | Sun et al. | |
| 9,034,199 B2 | 5/2015 | Duan et al. | |
| 9,051,219 B2 | 6/2015 | Sun et al. | |
| 9,090,046 B2 | 7/2015 | Sun et al. | |
| 9,212,099 B2 | 12/2015 | Sun et al. | |
| 9,236,229 B2 | 1/2016 | Eto et al. | |
| 9,440,886 B2 * | 9/2016 | Sun ........................ | C04B 35/50 |
| 9,617,188 B2 * | 4/2017 | Sun ........................ | C04B 35/50 |
| 9,884,787 B2 * | 2/2018 | Sun ........................ | C04B 35/50 |
| 9,890,086 B2 * | 2/2018 | Sun ........................ | C04B 35/50 |
| 2002/0009560 A1 | 1/2002 | Ozono | |
| 2002/0018921 A1 | 2/2002 | Yamada et al. | |
| 2002/0100424 A1 | 8/2002 | Sun et al. | |
| 2003/0029563 A1 | 2/2003 | Kaushal et al. | |
| 2003/0059653 A1 | 3/2003 | Yamada et al. | |
| 2003/0110708 A1 | 6/2003 | Rosenflanz | |
| 2003/0200929 A1 | 10/2003 | Otsuki | |
| 2003/0215643 A1 | 11/2003 | Morita et al. | |
| 2004/0229078 A1 | 11/2004 | Maeda | |
| 2005/0037193 A1 | 2/2005 | Sun et al. | |
| 2005/0227118 A1 | 10/2005 | Uchimaru et al. | |
| 2006/0043067 A1 | 3/2006 | Kadkhodayan et al. | |
| 2007/0042897 A1 | 2/2007 | Aihara et al. | |
| 2007/0274837 A1 | 11/2007 | Taylor et al. | |
| 2008/0009417 A1 | 1/2008 | Lou et al. | |
| 2008/0026160 A1 | 1/2008 | Taylor et al. | |
| 2008/0029032 A1 | 2/2008 | Sun et al. | |
| 2008/0108225 A1 | 5/2008 | Sun et al. | |
| 2008/0145674 A1 | 6/2008 | Darolia et al. | |
| 2008/0160172 A1 | 7/2008 | Taylor et al. | |
| 2008/0213496 A1 | 9/2008 | Sun et al. | |
| 2008/0213617 A1 | 9/2008 | Taylor et al. | |
| 2008/0220209 A1 | 9/2008 | Taylor et al. | |
| 2008/0226894 A1 | 9/2008 | Kobayashi et al. | |
| 2008/0237543 A1 | 10/2008 | Kobayashi et al. | |
| 2008/0264564 A1 | 10/2008 | Sun et al. | |
| 2008/0264565 A1 | 10/2008 | Sun et al. | |
| 2009/0036292 A1 | 2/2009 | Sun et al. | |
| 2009/0214825 A1 | 8/2009 | Sun et al. | |
| 2010/0119843 A1 | 5/2010 | Sun et al. | |
| 2010/0129670 A1 | 5/2010 | Sun et al. | |
| 2010/0160143 A1 | 6/2010 | Sun et al. | |
| 2011/0198034 A1 | 8/2011 | Sun et al. | |
| 2012/0003102 A1 | 1/2012 | Taylor et al. | |
| 2012/0034469 A1 | 2/2012 | Sun et al. | |
| 2012/0104703 A1 | 5/2012 | Sun et al. | |
| 2012/0122651 A1 | 5/2012 | Taylor et al. | |
| 2012/0125488 A1 | 5/2012 | Sun et al. | |
| 2012/0183790 A1 | 7/2012 | Petorak et al. | |
| 2013/0022838 A1 | 1/2013 | Sun et al. | |
| 2013/0023401 A1 | 1/2013 | Watanabe et al. | |
| 2013/0216783 A1 | 8/2013 | Duan et al. | |
| 2013/0216821 A1 | 8/2013 | Sun et al. | |
| 2013/0224498 A1 | 8/2013 | Sun et al. | |
| 2013/0273313 A1 | 10/2013 | Sun et al. | |
| 2013/0273327 A1 | 10/2013 | Sun et al. | |
| 2013/0284373 A1 | 10/2013 | Sun et al. | |
| 2013/0288037 A1 | 10/2013 | Sun et al. | |
| 2013/0330507 A1 | 12/2013 | Taylor et al. | |
| 2014/0030486 A1 | 1/2014 | Sun et al. | |
| 2014/0030533 A1 | 1/2014 | Sun et al. | |
| 2014/0079946 A1 | 3/2014 | Jindo et al. | |
| 2014/0154465 A1 | 6/2014 | Sun et al. | |
| 2014/0159325 A1 | 6/2014 | Parkhe et al. | |
| 2014/0177123 A1 | 6/2014 | Thach et al. | |
| 2014/0178632 A1 | 6/2014 | Taylor et al. | |
| 2014/0221188 A1 | 8/2014 | Banda et al. | |
| 2014/0263272 A1 | 9/2014 | Duan et al. | |
| 2014/0334060 A1 | 11/2014 | Parkhe et al. | |
| 2014/0334939 A1 | 11/2014 | Taylor et al. | |
| 2014/0349073 A1 | 11/2014 | Sun et al. | |
| 2014/0363596 A1 | 12/2014 | Sun et al. | |
| 2014/0377504 A1 | 12/2014 | Sun et al. | |
| 2015/0021324 A1 | 1/2015 | Sun et al. | |
| 2015/0024155 A1 | 1/2015 | Sun et al. | |
| 2015/0075714 A1 | 3/2015 | Sun et al. | |
| 2015/0079370 A1 | 3/2015 | Sun et al. | |
| 2015/0133285 A1 | 5/2015 | Sun et al. | |
| 2015/0158775 A1 | 6/2015 | Sun et al. | |
| 2015/0218057 A1 | 8/2015 | Duan et al. | |
| 2015/0270108 A1 | 9/2015 | Sun et al. | |
| 2015/0299050 A1 | 10/2015 | Sun et al. | |
| 2015/0307982 A1 | 10/2015 | Firouzdor et al. | |
| 2015/0311043 A1 | 10/2015 | Sun et al. | |
| 2015/0311044 A1 | 10/2015 | Sun et al. | |
| 2015/0321964 A1 | 11/2015 | Sun et al. | |
| 2015/0329430 A1 | 11/2015 | Sun et al. | |

(56) References Cited

U.S. PATENT DOCUMENTS

2015/0329955 A1  11/2015  Sun et al.
2016/0211121 A1   7/2016  Sun et al.

FOREIGN PATENT DOCUMENTS

| | | |
|---|---|---|
| JP | 2001181042 | 7/2001 |
| JP | 2002241971 | 8/2002 |
| JP | 2005335990 | 12/2005 |
| JP | 2006069843 | 3/2006 |
| JP | 2007-217779 | 8/2007 |
| JP | 2009068066 | 4/2009 |
| JP | 2016089241 | 5/2016 |
| KR | 2012-0057272 | 6/2012 |
| WO | 2007/148931 | 12/2007 |
| WO | 2012/033326 A2 | 3/2012 |
| WO | 2013/126466 A1 | 8/2013 |
| WO | 2013/155220 A1 | 10/2013 |
| WO | 2013-162909 A1 | 10/2013 |
| WO | 2014/018830 A1 | 1/2014 |
| WO | 2014/018835 A1 | 1/2014 |
| WO | 2014/0123323 | 8/2014 |
| WO | 2014/190211 | 11/2014 |
| WO | 2014/197203 | 12/2014 |
| WO | 2014/205212 | 12/2014 |
| WO | 2015/009745 | 1/2015 |
| WO | 2015/013070 | 1/2015 |
| WO | 2015/042196 | 3/2015 |

OTHER PUBLICATIONS

Andrievskaya et al, "The System $HfO_2$—$Y_2O_3$—$Er_2O_3$" J. Am. Ceram. Soc., Mar. 1996, pp. 714-720, vol. 79, No. 3.

\* cited by examiner

RARE-EARTH OXIDE BASED CHAMBER MATERIAL

RELATED APPLICATIONS

This patent application is a continuation application of U.S. application Ser. No. 15/211,933, filed Jul. 15, 2016, now U.S. Pat. No. 9,884,787, which is a divisional application of U.S. application Ser. No. 14/531,785, filed Nov. 3, 2014, now U.S. Pat. No. 9,440,886, which claims the benefit under 35 U.S.C. § 119(e) of U.S. Provisional Application No. 61/903,215, filed Nov. 12, 2013, all of which are incorporated by reference herein.

TECHNICAL FIELD

Embodiments of the present invention relate, in general, to plasma resistant rare-earth oxide materials, and in particular to solid sintered ceramic articles formed from the plasma resistant rare-earth oxide materials.

BACKGROUND

In the semiconductor industry, devices are fabricated by a number of manufacturing processes producing structures of an ever-decreasing size. Some manufacturing processes such as plasma etch and plasma clean processes expose a substrate to a high-speed stream of plasma to etch or clean the substrate. The plasma may be highly corrosive, and may corrode processing chambers and other surfaces that are exposed to the plasma. This corrosion may generate particles, which frequently contaminate the substrate that is being processed, contributing to device defects. Additionally, the corrosion may cause metal atoms from chamber components to contaminate processed substrates (e.g., processed wafers).

As device geometries shrink, susceptibility to defects and metal contamination increases, and particle contaminant specifications and metal contaminant specifications become more stringent. Accordingly, as device geometries shrink, allowable levels of particle defects and metal contamination may be reduced. To minimize particle defects and metal contamination introduced by plasma etch and/or plasma clean processes, chamber materials have been developed that are resistant to plasmas. Examples of such plasma resistant materials include ceramics composed to $Al_2O_3$, AlN, SiC and $Y_2O_3$. However, the plasma resistance properties of these ceramic materials may be insufficient for some applications. For example, plasma resistant ceramic lids and/or nozzles that are manufactured using traditional ceramic manufacturing processes may produce unacceptable levels of particle defects when used in plasma etch processes of semiconductor devices with critical dimensions of 90 nm or lower.

SUMMARY

In one example implementation, an article comprises a plasma resistant ceramic material comprising 80-90 mol % of $Y_2O_3$, over 0 mol % to 20 mol % of $ZrO_2$, and 10-20 mol % of $Al_2O_3$.

In another example implementation, an article comprise a metal portion and a solid sintered ceramic portion bonded to the metal portion. The solid sintered ceramic portion comprises a plasma resistant ceramic material comprising 80-90 mol % of $Y_2O_3$, over 0 mol % to 20 mol % of $ZrO_2$, and 10-20 mol % of $Al_2O_3$.

In another example implementation, an article comprises a body and a plasma resistant ceramic coating on at least one surface of the body. The plasma resistant ceramic coating comprises a plasma resistant ceramic material comprising 80-90 mol % of $Y_2O_3$, over 0 mol % to 20 mol % of $ZrO_2$, and 10-20 mol % of $Al_2O_3$.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
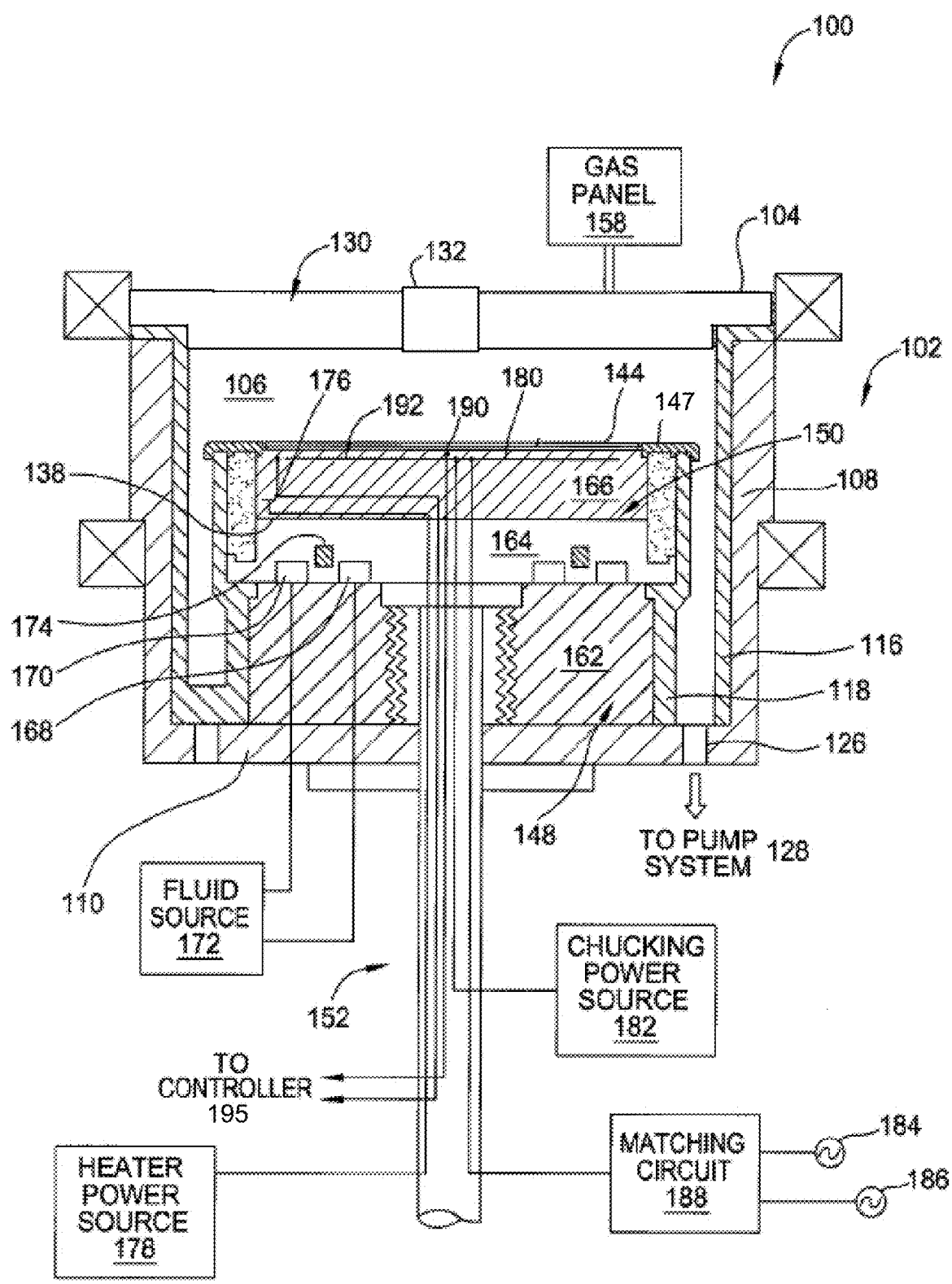
FIG. 1 is a sectional view of a semiconductor processing chamber having one or more chamber components that are solid sintered ceramic articles created using ceramic materials provided in embodiments herein.

Embodiments of the invention are directed to new sintered ceramic materials and to methods of manufacturing these new sintered ceramic materials. In embodiments, the sintered ceramic materials may have a solid solution that includes $Y_2O_3$ at a concentration of approximately 30 molar % to approximately 60 molar %, $Er_2O_3$ at a concentration of approximately 20 molar % to approximately 60 molar %, and at least one of $ZrO_2$, $Gd_2O_3$ or $SiO_2$ at a concentration of approximately 0 molar % to approximately 30 molar %. In other embodiments, the sintered ceramic materials may have a solid solution that includes a mixture of $Y_2O_3$, $ZrO_2$, and/or $Al_2O_3$. The new sintered ceramic materials may be used to create chamber components for a plasma etch reactor. Use of chamber components created with the new sintered ceramic materials described herein in a plasma etch reactor may cause on wafer metal contamination and/or particle defects to be greatly reduced as compared to use of chamber components created with conventional plasma resistant ceramic materials. In particular, metal contamination of yttrium, aluminum and zinc may be greatly reduced by use of the ceramic materials described in embodiments herein. Reduction of these metal contaminants on processed wafers may be dictated by manufacturers of semiconductors, displays, photovoltaics, micro-electro-mechanical systems (MEMS)) devices and so forth.

When the terms "about" and "approximate" are used herein, this is intended to mean that the nominal value presented is precise within ±10%.

Embodiments are described with reference to solid sintered ceramic articles that are chamber components for a plasma etch reactor (also referred to as a plasma etcher). For example, the ceramic articles may be process kit rings, chamber lid, gas distribution plates, shower heads, electrostatic chucks, and lift pins. However, the solid sintered ceramic materials described herein may also be used for other devices having components that are exposed to a plasma environment, such as a plasma cleaner, a plasma propulsion system, and so forth. Moreover, embodiments are described with reference to solid sintered ceramic articles. However, discussed embodiments also apply to deposited ceramic coatings, such as plasma sprayed ceramic coatings and ceramic coatings applied using ion assisted deposition (IAD) techniques. Accordingly, it should be understood that discussion of solid sintered ceramic materials also applies to deposited ceramic materials of the same compositions.

Embodiments are described herein with reference to ceramic articles that cause reduced particle defects and metal contamination when used in a process chamber for plasma etch and/or plasma clean processes. However, it should be understood that the ceramic articles discussed herein may also provide reduced particle defects and metal contamination when used in process chambers for other processes such as plasma enhanced chemical vapor deposition (PECVD), plasma enhanced physical vapor deposition (PEPVD), plasma enhanced atomic layer deposition (PEALD), and so forth, and non-plasma etchers, non-plasma cleaners, chemical vapor deposition (CVD) furnaces, physical vapor deposition (PVD) furnaces, and so forth.

FIG. 1 is a sectional view of a semiconductor processing chamber 100 having one or more chamber components that are solid sintered ceramic articles created using ceramic materials provided in embodiments herein. The processing chamber 100 may be used for processes in which a corrosive plasma environment is provided. For example, the processing chamber 100 may be a chamber for a plasma etch reactor (also known as a plasma etcher), a plasma cleaner, and so forth. Examples of chamber components that may be composed of or include a solid sintered plasma resistant ceramic material include an electrostatic chuck (ESC) 150, a ring (e.g., a process kit ring or single ring), a chamber wall, a gas distribution plate, a showerhead, a liner, a liner kit, a chamber lid 104, a nozzle 132, and so on. The solid sintered ceramic material used to form one or more of these chamber components is described in more detail below with reference to FIG. 2.

In one embodiment, the processing chamber 100 includes a chamber body 102 and a lid 130 that enclose an interior volume 106. The lid 130 may have a hole in its center, and the nozzle 132 may be inserted into the hole. In some embodiments, a showerhead is used instead of the lid 130 and nozzle 132. The chamber body 102 may be fabricated from aluminum, stainless steel or other suitable material. The chamber body 102 generally includes sidewalls 108 and a bottom 110. Any of the lid 130, nozzle 132, showerhead, and so on may include the solid sintered ceramic material.

An outer liner 116 may be disposed adjacent the sidewalls 108 to protect the chamber body 102. Outer liner 116 can be a plasma resistant layer made from rare earth oxide based materials.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The lid 130 may be supported on the sidewall 108 of the chamber body 102. The lid 130 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through the nozzle 132. Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $NF_3$, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases). A substrate support assembly 148 is disposed in the interior volume 106 of the processing chamber 100 below the lid 130. The substrate support assembly 148 holds the substrate 144 during processing. A ring 147 (e.g., a single ring) may cover a portion of the electrostatic chuck 150, and may protect the covered portion from exposure to plasma during processing. The ring 147 may be formed of any of the solid sintered ceramic materials described herein.

An inner liner 118 may be formed on the periphery of the substrate support assembly 148. The inner liner 118 may be a halogen-containing gas resistant material such as those discussed with reference to the outer liner 116.

In one embodiment, the substrate support assembly 148 includes a mounting plate 162 supporting a pedestal 152, and an electrostatic chuck 150. The electrostatic chuck 150 further includes a thermally conductive base 164 and an electrostatic puck 166 bonded to the thermally conductive base by a bond 138, which may be a silicone bond in one embodiment. The mounting plate 162 is coupled to the bottom 110 of the chamber body 102 and includes passages for routing utilities (e.g., fluids, power lines, sensor leads, etc.) to the thermally conductive base 164 and the electrostatic puck 166.

The thermally conductive base 164 and/or electrostatic puck 166 may include one or more optional embedded heating elements 176, embedded thermal isolator 174 and/or conduits 168, 170 to control a lateral temperature profile of the substrate support assembly 148. The conduits 168, 170 may be fluidly coupled to a fluid source 172 that circulates a temperature regulating fluid through the conduits 168, 170. The embedded thermal isolator 174 may be disposed between the conduits 168, 170 in one embodiment. The heating elements 176 are regulated by a heater power source 178. The conduits 168, 170 and heating elements 176 may be utilized to control the temperature of the thermally conductive base 164, thereby heating and/or cooling the electrostatic puck 166 and a substrate (e.g., a wafer) 144 being processed. The temperature of the electrostatic puck 166 and the thermally conductive base 164 may be monitored using a plurality of temperature sensors 190, 192, which may be monitored using a controller 195.

The electrostatic puck 166 may further include multiple gas passages such as grooves, mesas and other surface features that may be formed in an upper surface of the electrostatic puck 166. The gas passages may be fluidly coupled to a source of a heat transfer (or backside) gas such as He via holes drilled in the electrostatic puck 166. In operation, the backside gas may be provided at controlled pressure into the gas passages to enhance the heat transfer between the electrostatic puck 166 and the substrate 144.

The electrostatic puck 166 includes at least one clamping electrode 180 controlled by a chucking power source 182. The at least one clamping electrode 180 (or other electrode disposed in the electrostatic puck 166 or conductive base 164) may further be coupled to one or more RF power sources 184, 186 through a matching circuit 188 for maintaining a plasma formed from process and/or other gases within the processing chamber 100. The RF power sources 184, 186 are generally capable of producing RF signal having a frequency from about 50 kHz to about 3 GHz and a power of up to about 10,000 Watts.

Figure 2:
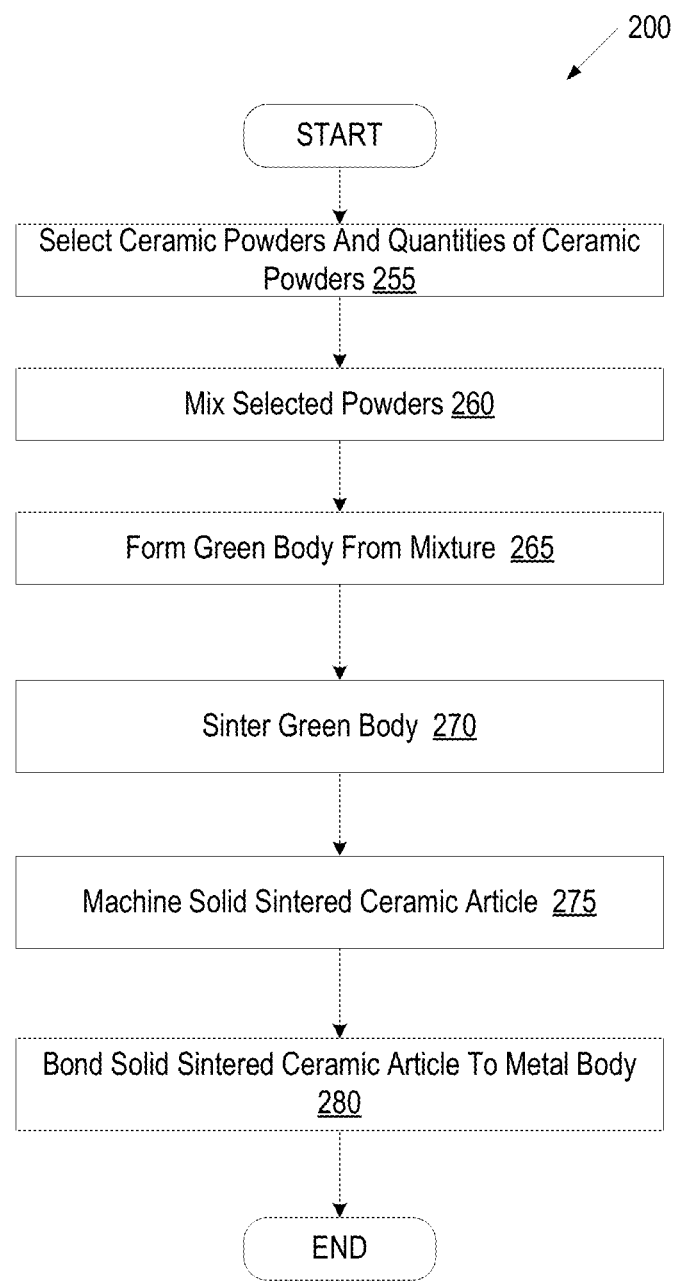
FIG. 2 illustrates a process for forming a solid sintered ceramic article, in accordance with one embodiment of the present invention.

FIG. 2 is a flow chart showing a process 200 for manufacturing a solid sintered ceramic article, in accordance with one embodiment of the present invention. At block 255, ceramic powders that are to be used to form the ceramic article are selected. Quantities of the selected ceramic powders are also selected.

In one embodiment, the selected ceramic powders include $Y_2O_3$, $Er_2O_3$, and one or more additional rare earth oxides that will form a phase with the $Y_2O_3$ and the $Er_2O_3$. The additional rare earth oxides should also be erosion resistant and have a high density (low porosity). Examples of the additional rare earth oxides that may be used include $ZrO_2$ and $Gd_2O_3$. Non-rare earth oxides can also be used such as $Al_2O_3$ & $SiO_2$. In one embodiment, the ceramic powders include $Y_2O_3$ at a concentration of approximately 30 molar % (mol %) to approximately 60 molar %, $Er_2O_3$ at a concentration of approximately 20 molar % to approximately 60 molar %, and at least one of $ZrO_2$, $Gd_2O_3$ or $SiO_2$ at a concentration of approximately 0 molar % to approximately 30 molar %. In one embodiment, the selected ceramic powders include $Y_2O_3$ at a concentration of approximately 30-60 molar %, $Er_2O_3$ at a concentration of approximately 20-55 molar %, and one or more of $ZrO_2$ at a concentration of up to 20 molar %, $Gd_2O_3$ at a concentration of up to 20 molar %, and $SiO_2$ at a concentration of up to 30 molar %.

One specific mixture of ceramic powders that may be used (termed example 1++) includes $Y_2O_3$ at a concentration of approximately 40 molar %, $ZrO_2$ at a concentration of approximately 5 molar %, $Er_2O_3$ at a concentration of approximately 35 molar %, $Gd_2O_3$ at a concentration of approximately 5 molar %, and $SiO_2$ at a concentration of approximately 15 molar %. Another specific mixture of ceramic powders that may be used (termed example 2++) includes $Y_2O_3$ at a concentration of approximately 45 molar %, $ZrO_2$ at a concentration of approximately 5 molar %, $Er_2O_3$ at a concentration of approximately 35 molar %, $Gd_2O_3$ at a concentration of approximately 10 molar %, and $SiO_2$ at a concentration of approximately 5 molar %. Another specific mixture of ceramic powders that may be used (termed example 3++) includes $Y_2O_3$ at a concentration of approximately 40 molar %, $ZrO_2$ at a concentration of approximately 5 molar %, $Er_2O_3$ at a concentration of approximately 40 molar %, $Gd_2O_3$ at a concentration of approximately 7 molar %, and $SiO_2$ at a concentration of approximately 8 molar %. Another specific mixture of ceramic powders that may be used (termed example 4++) includes $Y_2O_3$ at a concentration of approximately 37 molar %, $ZrO_2$ at a concentration of approximately 8 molar %, and $Er_2O_3$ at a concentration of approximately 55 molar %. Another specific mixture of ceramic powders that may be used (termed example 5++) includes $Y_2O_3$ at a concentration of approximately 40 molar %, $ZrO_2$ at a concentration of approximately 10 molar %, $Er_2O_3$ at a concentration of approximately 30 molar %, and $Gd_2O_3$ at a concentration of approximately 20 molar %.

In one embodiment, the selected ceramic powders include 40-60 mol % of $Y_2O_3$, 30-50 mol % of $ZrO_2$, and 10-20 mol % of $Al_2O_3$. In another embodiment, the selected ceramic powders include 40-50 mol % of $Y_2O_3$, 20-40 mol % of $ZrO_2$, and 20-40 mol % of $Al_2O_3$. In another embodiment, the selected ceramic powders include 70-90 mol % of $Y_2O_3$, 0-20 mol % of $ZrO_2$, and 10-20 mol % of $Al_2O_3$. In another embodiment, the selected ceramic powders include 60-80 mol % of $Y_2O_3$, 0-10 mol % of $ZrO_2$, and 20-40 mol % of $Al_2O_3$. In another embodiment, the selected ceramic powders include 40-60 mol % of $Y_2O_3$, 0-20 mol % of $ZrO_2$, and 30-40 mol % of $Al_2O_3$. In another embodiment, the selected ceramic powders include 40-100 mol % of $Y_2O_3$, 0-60 mol % of $ZrO_2$, and 0-5 mol % of $Al_2O_3$.

In one embodiment, the selected ceramic powders include 40-100 mol % of $Y_2O_3$, 0-60 mol % of $ZrO_2$, and 0-5 mol % of $Al_2O_3$. In a first example (termed example 1+), the selected ceramic powders include 73-74 mol % of $Y_2O_3$ and 26-27 mol % of $ZrO_2$. In a second example (termed example 2+), the selected ceramic powders include 71-72 mol % of $Y_2O_3$, 26-27 mol % of $ZrO_2$, and 1-2 mol % of $Al_2O_3$. In a third example (termed example 3+), the selected ceramic powders include 64-65 mol % of $Y_2O_3$ and 35-36 mol % of $ZrO_2$. In a fourth example (termed example 4+), the selected ceramic powders include 63-64 mol % of $Y_2O_3$, 35-36 mol % of $ZrO_2$, and 1-2 mol % of $Al_2O_3$. In a fifth example (termed example 5+), the selected ceramic powders include 57-58 mol % of $Y_2O_3$, 42-43 mol % of $ZrO_2$. In a sixth example (termed example 6+), the selected ceramic powders include 52-53 mol % of $Y_2O_3$, 47-48 mol % of $ZrO_2$.

Any of the aforementioned sintered solids may include trace amounts of other materials such as $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides.

At block 260, the selected ceramic powders are mixed. In one embodiment, the selected powders are mixed with water, a binder and a deflocculant to form a slurry. In one embodiment, the ceramic powders are combined into a granular powder by spray drying.

At block 265, a green body (an unsintered ceramic article) is formed from the mixed powders (e.g., from the slurry formed from a mixture of the selected ceramic powders). The green body can be formed using techniques including, but not limited to, slip casting, tape casting, cold isostatic pressing, unidirectional mechanical pressing, injection molding, and extrusion. For example, the slurry may be spray dried, placed into a mold, and pressed to form the green body in one embodiment.

At block 270, the green body is sintered. Sintering the green body may include heating the green body to a high temperature that is below the melting point of any of the constituent rare earth oxides in the green body. For example, if the green body includes $Y_2O_3$, $Er_2O_3$, $ZrO_2$, $Gd_2O_3$ or $SiO_2$, then the green body may be heated to any point below the melting points of $Y_2O_3$, $Er_2O_3$, $ZrO_2$, $Gd_2O_3$ and $SiO_2$. In one embodiment, the sintering is preceded by heating the green body to a low temperature to burn off a binder that was used in the formation of the green body. The green bodies can be sintered at 1500-2100° C. for a time of 3-30 hours (hr).

The sintering process produces a solid sintered ceramic article that includes at least one solid solution made up of the various constituent ceramic materials in a single phase. For example, in one embodiment, the solid sintered ceramic article includes a solid solution that includes $Y_2O_3$ at a concentration of approximately 30 molar % to approximately 60 molar %, $Er_2O_3$ at a concentration of approximately 20 molar % to approximately 50 molar %, and at least one of $ZrO_2$, $Gd_2O_3$ or $SiO_2$ at a concentration of approximately 0 molar % to approximately 30 molar %.

In various embodiments, the solid sintered ceramic article may be used for different chamber components of a plasma etch reactor. Depending on the particular chamber component that is being produced, the green body may have different shapes. For example, if the ultimate chamber component is to be a process kit ring, then the green body may be in the shape of a ring. If the chamber component is to be an electrostatic puck for an electrostatic chuck, then the green body may be in the shape of a disc. The green body may also have other shapes depending on the chamber component that is to be produced.

The sintering process typically changes the size of the ceramic article by an uncontrolled amount. Due at least in part to this change in size, the ceramic article is typically machined after the sintering process is completed at block 275. The machining may include surface grinding and/or polishing the ceramic article, drilling holes in the ceramic article, cutting and/or shaping the ceramic article, grinding the ceramic article, polishing the ceramic article (e.g., using chemical mechanical planarization (CMP), flame polishing, or other polishing techniques), roughening the ceramic article (e.g., by bead blasting), forming mesas on the ceramic article, and so forth.

The ceramic article may be machined into a configuration that is appropriate for a particular application. Prior to machining, the ceramic article may have a rough shape and size appropriate for a particular purpose (e.g., to be used as a lid in a plasma etcher). However, the machining may be performed to precisely control size, shape, dimensions, hole sizes, and so forth of the ceramic article.

Depending on the particular chamber component that is to be produced, additional processing operations may additionally be performed. In one embodiment, the additional processing operations include bonding the solid sintered ceramic article to a metal body (block 280). In some instances, in which the solid sintered ceramic article is both machined and bonded to a metal body, the machining may be performed first, followed by the bonding. In other instances, the solid sintered ceramic article may first be bonded to a metal body, and may then be machined. In other embodiments, some machining is performed both before and after the bonding. Additionally, in some embodiments the solid sintered ceramic article may be bonded to another ceramic article.

In a first example, the ceramic article is to be used for a showerhead. In such an embodiment, many holes may be drilled into the ceramic article, and the ceramic article may be bonded to an aluminum gas distribution plate. In a second example, the ceramic article is used for an electrostatic chuck. In such an embodiment, helium pin holes are drilled into the ceramic article (e.g., by laser drilling), and the ceramic article may be bonded by a silicone bond to an aluminum base plate. In another example, the ceramic article is a ceramic lid. Since the ceramic lid has a large surface area, the ceramic lid formed from the new sintered ceramic material may have a high structural strength to prevent cracking or buckling during processing (e.g., when a vacuum is applied to a process chamber of the plasma etch reactor). In other examples, a nozzle, a process kit ring, or other chamber component is formed.

Figure 3:
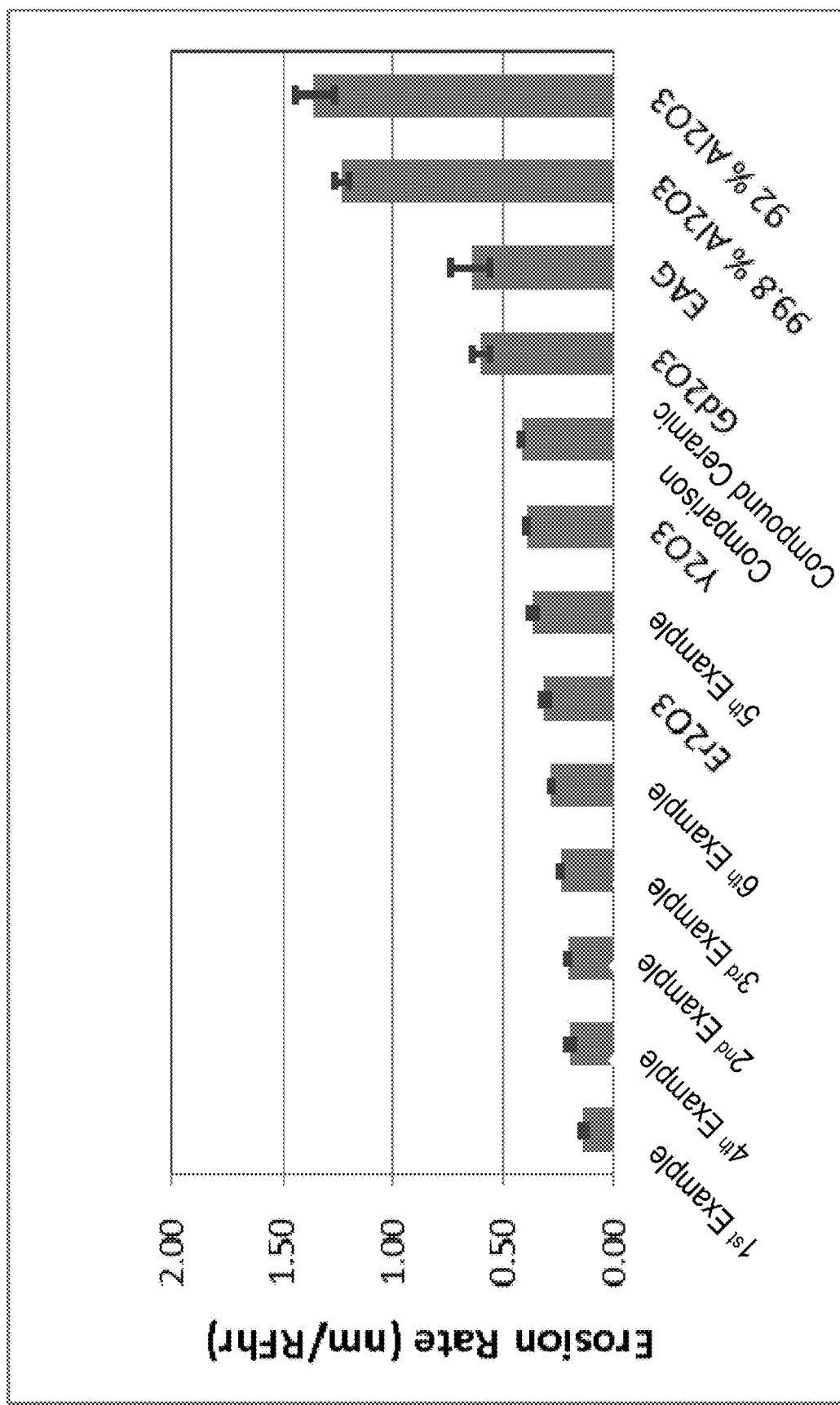
FIG. 3 shows sputter resistance of various solid sintered ceramic articles to a plasma generated under a bias power of 2200 Watts, in accordance with embodiments of the present invention.

FIG. 3 is a chart showing sputter resistance of various solid sintered ceramic articles to a plasma generated under a bias power of 2200 Watts, in accordance with embodiments of the present invention. The chart shows a sputter erosion rate of between 0.10 and 0.15 nanometer per radiofrequency hour (nm/RFhr) for a first example solid sintered ceramic article (example 1+) composed of 73.13 molar % $Y_2O_3$ and 26.87 molar % $ZrO_2$. The chart shows a sputter erosion rate of between 0.15 and 0.20 nm/RFhr for a fourth example solid sintered ceramic article (example 4+) composed of 63.56 molar % $Y_2O_3$, 35.03 molar % $ZrO_2$, and 1.41 molar % $Al_2O_3$. The chart shows a sputter erosion rate of between 0.15 and 0.20 nm/RFhr for a second example solid sintered ceramic article (example 2+) composed of 71.96 molar % $Y_2O_3$, 26.44 molar % $ZrO_2$, and 1.60 molar % $Al_2O_3$. The chart shows a sputter erosion rate of between 0.20 and 0.25 nm/RFhr for a third example solid sintered ceramic article (example 3+) composed of 64.46 molar % $Y_2O_3$ and 35.54 molar % $ZrO_2$. The chart shows a sputter erosion rate of between 0.25 and 0.30 nm/RFhr for a sixth example solid sintered ceramic article (example 6+) composed of 52.12 molar % $Y_2O_3$ and 47.88 molar % $ZrO_2$. The chart shows a sputter erosion rate of between 0.30 and 0.35 nm/RFhr for a fifth example solid sintered ceramic article (example 5+) composed of 57.64 molar % $Y_2O_3$ and 42.36 molar % $ZrO_2$. The chart additionally shows sputter erosion resistance rates for solid sintered ceramics of $Er_2O_3$, $Y_2O_3$, $Gd_2O_3$, $Er_3Al_5O_{12}$ (EAG), 99.8% $Al_2O_3$, 92% $Al_2O_3$ and a comparison compound ceramic including 63 mol % $Y_2O_3$, 14 mol % $Al_2O_3$, and 23 mol % $ZrO_2$ for comparison.

Figure 4:
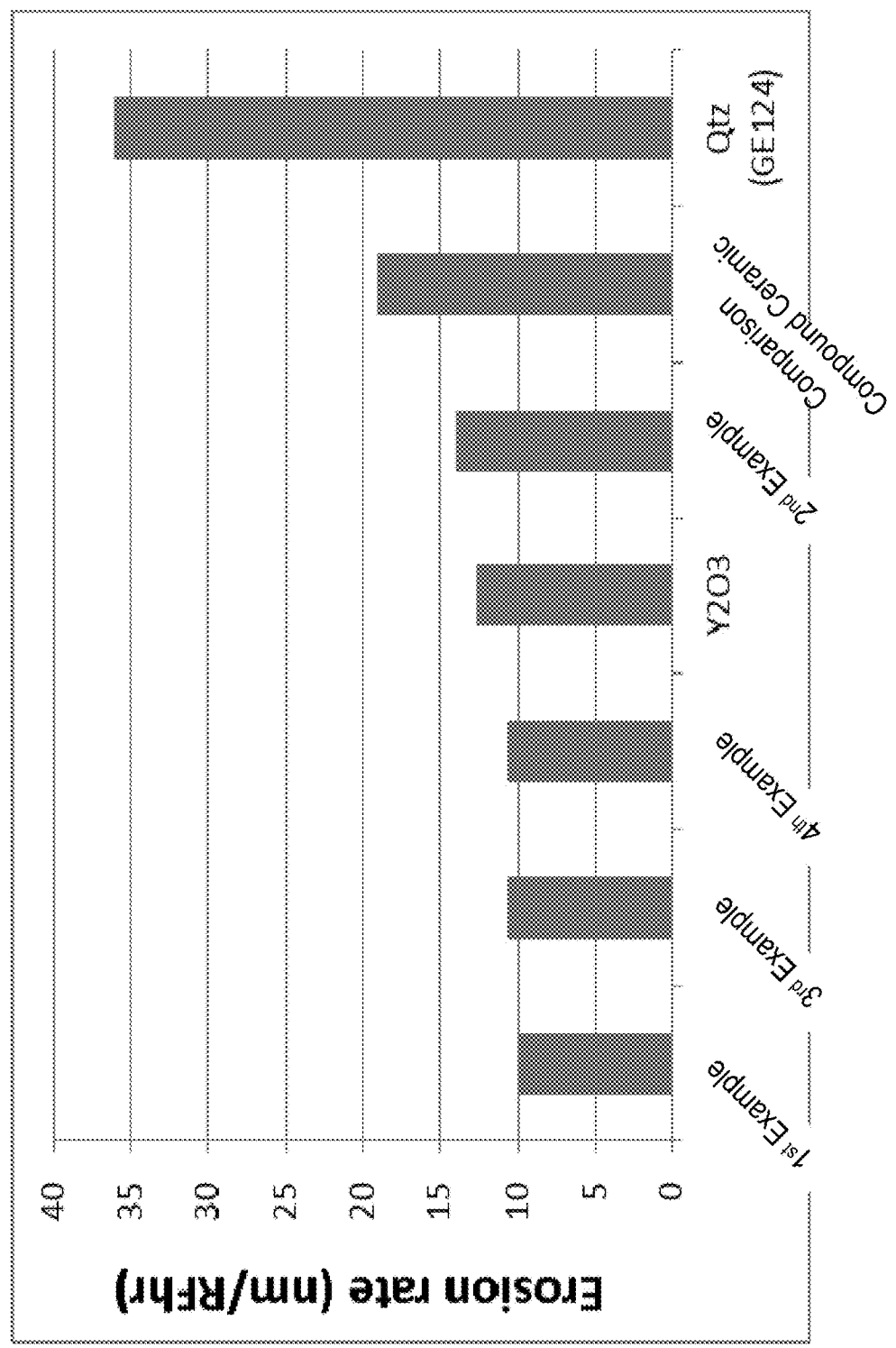
FIG. 4 shows erosion resistance of various solid sintered ceramic articles to a plasma generated using an $N_2/H_2$ chemistry, in accordance with embodiments of the present invention.

FIG. 4 is an additional chart showing erosion resistance of various solid sintered ceramic articles to a plasma generated using an $N_2/H_2$ chemistry, in accordance with embodiments of the present invention. The chart shows an erosion rate of about 10 nm/RFhr for the first example solid sintered ceramic article composed of 73.13 molar % $Y_2O_3$ and 26.87 molar % $ZrO_2$. The chart shows an erosion rate of just over 10 nm/RFhr for the third example solid sintered ceramic article composed of 64.46 molar % $Y_2O_3$ and 35.54 molar % $ZrO_2$. The chart shows an erosion rate of just over 10 nm/RFhr for the fourth example solid sintered ceramic article composed of 63.56 molar % $Y_2O_3$, 35.03 molar % $ZrO_2$, and 1.41 molar % $Al_2O_3$. The chart shows an erosion rate of under 15 nm/RFhr for the second example solid sintered ceramic article composed of 71.96 molar % $Y_2O_3$, 26.44 molar % $ZrO_2$, and 1.60 molar % $Al_2O_3$. The chart additionally shows erosion rates for solid sintered ceramics of $Y_2O_3$, quartz and HPM for comparison.

Figure 5:
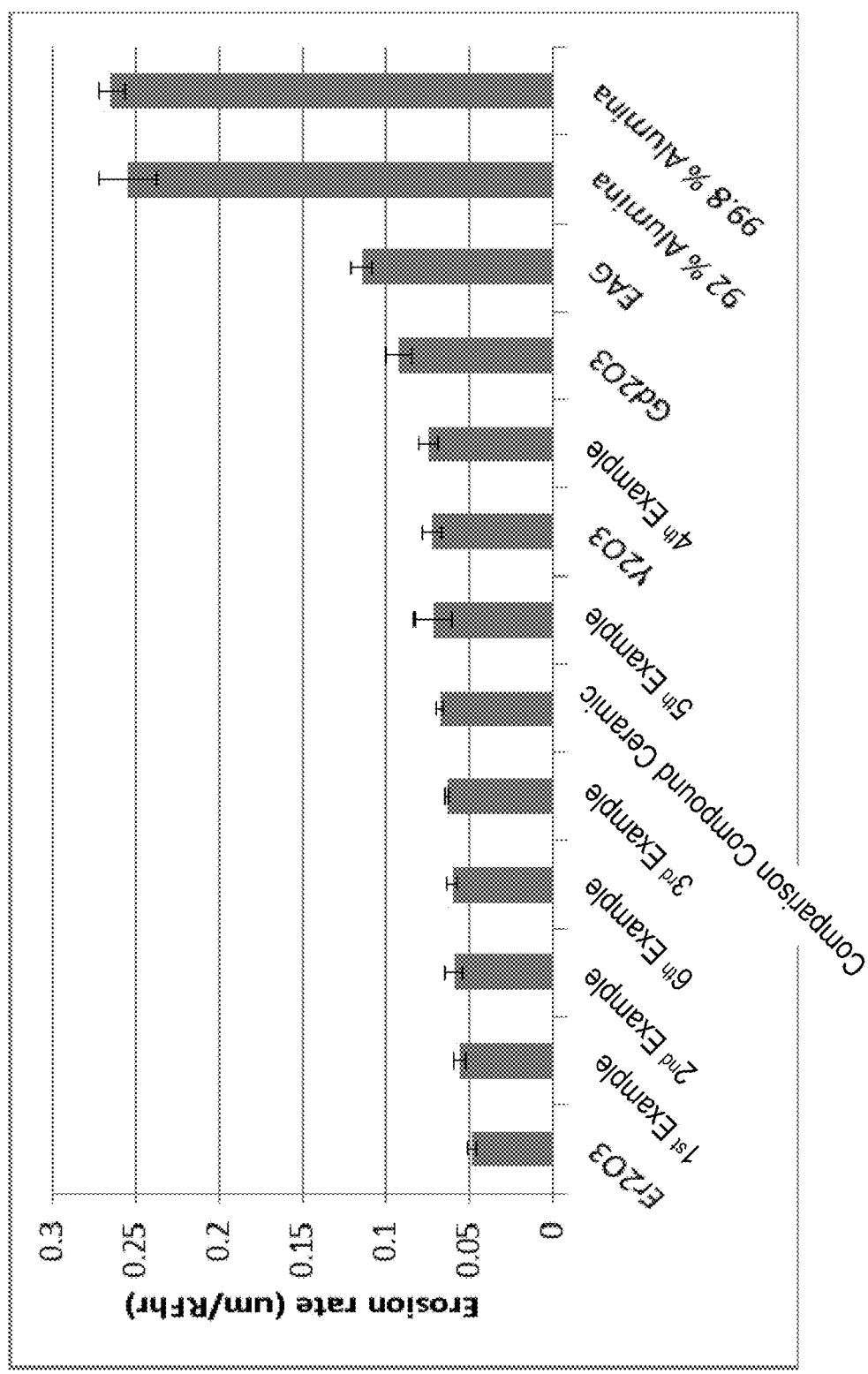
FIG. 5 shows erosion resistance of various solid sintered ceramic articles to a plasma generated using a $CHF_4/CF_4$ chemistry, in accordance with embodiments of the present invention.

FIG. 5 is yet another chart showing erosion resistance of various solid sintered ceramic articles to a plasma generated using an $CHF_4/CF_4$ chemistry, in accordance with embodiments of the present invention. The chart shows erosion rates of just over 0.05 nm/RFhr for the first example solid sintered ceramic article (example 1+), second example solid sintered ceramic article (example 2+), sixth example solid sintered ceramic article (example 6+), and third example solid sintered ceramic article (example 3+) defined with reference to FIG. 3. The chart additionally shows erosion rates of just under 0.75 nm/RFhr for the fifth example solid sintered ceramic article (example 5+) and the fourth example solid sintered ceramic article (example 4+) defined with reference to FIG. 3. The chart additionally shows erosion rates for solid sintered ceramics of $Er_2O_3$, $Y_2O_3$, $Gd_2O_3$, EAG, 99.8% $Al_2O_3$, 92% $Al_2O_3$ and the comparison compound ceramic for comparison.

Figure 6A:
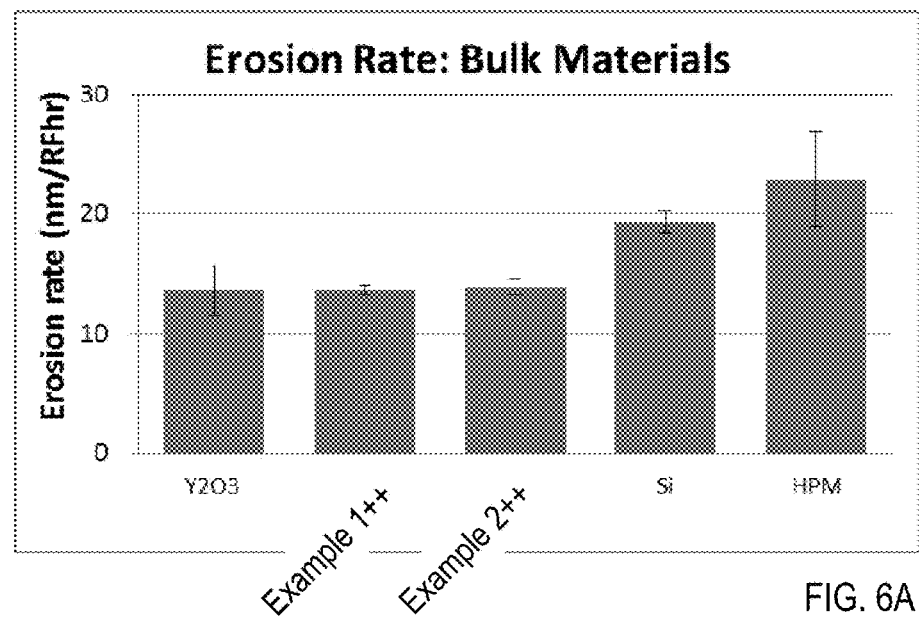
FIG. 6A is a chart showing erosion resistance of various solid sintered ceramic articles to a plasma generated using an $N_2/H_2$ chemistry, in accordance with embodiments of the present invention.

FIG. 6A is a chart showing erosion resistance of various solid sintered ceramic articles to a plasma generated using an $N_2/H_2$ chemistry, in accordance with embodiments of the present invention. The chart shows an erosion rate of under 15 nm/RFhr for yttria, for the example 4++ ceramic article, and for the example 5++ ceramic article. The chart also shows an erosion rate of just under 20 nm/RFhr for silicon and an erosion rate of over 20 nm/RFhr for the comparison compound ceramic. The example 4++ ceramic includes $Y_2O_3$ at a concentration of approximately 37 molar %, $ZrO_2$ at a concentration of approximately 8 molar %, and $Er_2O_3$ at a concentration of approximately 55 molar %. The example 5++ ceramic includes $Y_2O_3$ at a concentration of approximately 40 molar %, $ZrO_2$ at a concentration of approximately 10 molar %, $Er_2O_3$ at a concentration of approximately 30 molar %, and $Gd_2O_3$ at a concentration of approximately 20 molar %.

Figure 6B:
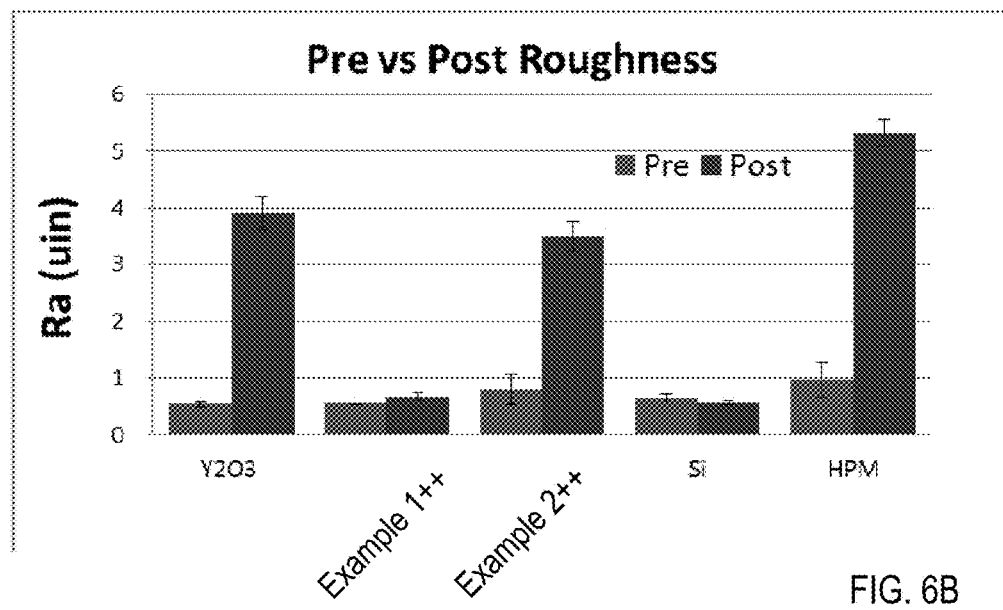
FIG. 6B is a chart showing pre-etch and post-etch roughness for various bulk sintered ceramic articles.

FIG. 6B is a chart showing pre-etch and post-etch roughness for solid sintered (bulk) yttria, example 4++, example 5++, silicon and the comparison compound ceramic. As shown, example 4++ and example 5++ solid sintered ceramics show minimum erosion rate and example 4++ shows minimal roughness change.

TABLE 1

Liquid particle count (LPC) for conductor lid in particles per square centimeter (p/cm²)

| Material | >=.2 μm | >=.3 μm | >=.5 μm | >=1 μm | >=2 μm |
|---|---|---|---|---|---|
| Compound Ceramic Lid | 24,875 | 7,417 | 3,053 | 772 | 145 |
| Example 1+ | 21,706 | 6,531 | 1,926 | 719 | 165 |

Table 1 shows particle defects measured post cleaning of a conductor lid made out of a comparison compound ceramic & the first example ceramic material (example 1+). The first example ceramic material consists of $Y_2O_3$ at a concentration of 73.13 molar % and $ZrO_2$ at a concentration of 26.87 molar %. The particle contamination may be measured by performing a liquid particle count (LPC). Each column in the table represents a number of particles that are at least a particular size.

TABLE 2A metal contamination in $10^{10}$ atoms/cm²

| Material | Ca | Cr | Cu | Fe | Mg | Mn |
|---|---|---|---|---|---|---|
| Compound Ceramic | <70 | <20 | <10 | 40 | <50 | <5 |
| Example 1+ | <70 | <20 | <10 | 26 | <50 | <5 |

TABLE 2B metal contamination in $10^{10}$ atoms/cm²

| | Material | | | |
|---|---|---|---|---|
| | Ni | K | Na | Ti | Zn |
| Compound Ceramic | <10 | <50 | <50 | <20 | <20 |
| Example 1+ | <10 | <50 | <50 | <20 | <20 |

Tables 2A and 2B show metal contamination on a wafer processed using a solid sintered ceramic lid of the comparison compound ceramic and the first example ceramic material. Metal contamination may be measured by inductively coupled plasma mass spectroscopy (ICPMS). Each column in the table represents a different metal contaminant. Different formulations of solid sintered ceramic articles described in embodiments herein have different on-wafer metal contamination levels depending on the compositions of those solid sintered ceramic articles. Therefore, based on different on-wafer metal contamination specifications of manufacturers, different formulations can be chosen to manufacture the corresponding chamber components.

TABLE 3 mechanical properties of example solid sintered ceramic articles

| Material | Hardness (GPa) | Elastic Modulus (GPa) | Bulk Density (g/cm³) | Water Absorption (%) |
|---|---|---|---|---|
| $Y_2O_3$ | 9.94 | 205 | 4.55 | N/A |
| Comparison Compound Ceramic | 13.28 | 225 | 4.9 | N/A |
| Example 1+ | 13.27 | 232 | N/A | N/A |
| Example 1++ | N/A | N/A | 6.39 | 0.035 |
| Example 2++ | N/A | N/A | 6.52 | 0.030 |
| Example 3++ | N/A | N/A | 6.64 | 0.032 |
| Example 4++ | N/A | N/A | 6.79 | 0.023 |

Table 3 shows mechanical properties of the first example (example 1+) solid sintered ceramic article defined with reference to FIG. 2, as well as additional example solid sintered ceramic articles example 1++, example 2++, example 3++, and example 4++ in comparison to mechanical properties of the comparison compound and $Y_2O_3$ solid sintered ceramic articles.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or."

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An article consisting of:
a solid sintered ceramic body comprising a plasma resistant ceramic material comprising 70 mol % to less than 90 mol % of $Y_2O_3$, over 0 mol % to 20 mol % of $ZrO_2$, and 10-20 mol % of $Al_2O_3$.

2. The article of claim 1, wherein the plasma resistant ceramic material further comprises trace amounts of at least one of $SiO_2$, $B_2O_3$, $Er_2O_3$, $Nd_2O_3$, $Nb_2O_5$, $CeO_2$, $Sm_2O_3$, or $Yb_2O_3$.

3. The article of claim 1, wherein the article is a chamber component for a plasma etch reactor.

4. The article of claim 1, wherein the article is a chamber component selected from a group consisting of a chuck, a lid, a nozzle, a gas distribution plate, a shower head, an electrostatic chuck component, and a processing kit ring.

5. The article of claim 1, wherein the plasma resistant ceramic material comprises at least one solid solution comprising the $Y_2O_3$ and the $ZrO_2$.

6. An article comprising:
a first body;
a solid sintered ceramic body comprising a plasma resistant ceramic material comprising 70 mol % to less than 90 mol % of $Y_2O_3$, over 0 mol % to 20 mol % of $ZrO_2$, and 10-20 mol % of $Al_2O_3$, wherein the solid sintered ceramic body is not a deposited coating; and
a bond bonding the first body to the solid sintered ceramic body.

7. The article of claim 6, wherein the plasma resistant ceramic material further comprises trace amounts of at least one of $SiO_2$, $B_2O_3$, $Er_2O_3$, $Nd_2O_3$, $Nb_2O_5$, $CeO_2$, $Sm_2O_3$, or $Yb_2O_3$.

8. The article of claim 6, wherein the article comprises a chamber component for a plasma etch reactor.

9. The article of claim 6, wherein the article comprises a chamber component selected from a group consisting of a chuck, a lid, a nozzle, a gas distribution plate, a shower head, an electrostatic chuck component, and a processing kit ring.

10. The article of claim 6, wherein the plasma resistant ceramic material comprises at least one solid solution comprising the $Y_2O_3$ and the $ZrO_2$.

11. The article of claim 1, wherein the $ZrO_2$ is present from greater than 0 mol % to 10 mol %, and wherein the $Al_2O_3$ is present from 10 mol % to less than 20 mol %.

12. The article of claim 11, wherein the $Y_2O_3$ is present from 80 mol % to less than 90 mol %.

13. The article of claim 6, wherein the $ZrO_2$ is present from greater than 0 mol % to 10 mol %, and wherein the $Al_2O_3$ is present from 10 mol % to less than 20 mol %.

14. The article of claim 13, wherein the $Y_2O_3$ is present from 80 mol % to less than 90 mol %.

15. The article of claim 6, wherein the first body is a metal body.

16. The article of claim 6, wherein the first body is a ceramic body.

17. The article of claim 6, wherein the bond is a silicone bond.

* * * * *